United States Patent
Hussain

(10) Patent No.: US 11,164,861 B2
(45) Date of Patent: Nov. 2, 2021

(54) MONOLITHIC ELECTRONIC DEVICE AND METHOD OF MANUFACTURE

(71) Applicant: KING ABDULLAH UNIVERSITY OF SCIENCE AND TECHNOLOGY, Thuwal (SA)

(72) Inventor: Muhammad Mustafa Hussain, Hercules, CA (US)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 16/771,470

(22) PCT Filed: Dec. 13, 2018

(86) PCT No.: PCT/IB2018/060058
§ 371 (c)(1),
(2) Date: Jun. 10, 2020

(87) PCT Pub. No.: WO2019/123152
PCT Pub. Date: Jun. 27, 2019

(65) Prior Publication Data
US 2021/0183853 A1    Jun. 17, 2021

Related U.S. Application Data

(60) Provisional application No. 62/608,217, filed on Dec. 20, 2017.

(51) Int. Cl.
*H01L 27/06*    (2006.01)
*H01L 21/822*    (2006.01)

(52) U.S. Cl.
CPC ...... *H01L 27/0694* (2013.01); *H01L 21/8221* (2013.01)

(58) Field of Classification Search
CPC .......... H01L 27/0694; H01L 21/8221
(Continued)

(56) References Cited

U.S. PATENT DOCUMENTS 7,040,922 B2 * 5/2006 Harney ............. G01C 21/16
361/810
7,067,352 B1   6/2006 Scheid
(Continued)

FOREIGN PATENT DOCUMENTS

| EP | 1041633 A1 | 10/2000 |
|---|---|---|
| EP | 2902294 A2 | 8/2015 |
| WO | 2018096454 A1 | 5/2018 |

OTHER PUBLICATIONS

International Search Report in corresponding/related International Application No. PCT/IB2018/060058, dated Apr. 8, 2019.
(Continued)

*Primary Examiner* — David Vu
*Assistant Examiner* — Brandon C Fox
(74) *Attorney, Agent, or Firm* — Patent Portfolio Builders PLLC

(57) ABSTRACT

A monolithic electronic device includes a plurality of rigid portions arranged in a polyhedron shape and a plurality of in-plane and out-of-plane deformable portions connecting the plurality of rigid portions to each other. Each of the plurality of rigid portions has an outer side and an opposing inner side. The inner of each of the plurality of rigid portions face an inside of the polyhedron shape. At least some of the plurality of rigid portions include semiconductor devices on both the outer and inner sides. The plurality of rigid portions and the plurality of in-plane and out-of-plane deformable portions are monolithic.

19 Claims, 7 Drawing Sheets

(58) Field of Classification Search
USPC .......................................................... 257/443
See application file for complete search history.

(56) References Cited

U.S. PATENT DOCUMENTS

| | | | | |
|---|---|---|---|---|
| 2004/0099938 | A1* | 5/2004 | Kang | H01L 23/5387 |
| | | | | 257/686 |
| 2016/0093504 | A1 | 3/2016 | Coronel et al. | |
| 2016/0195396 | A1* | 7/2016 | Sakuma | G01C 19/5783 |
| | | | | 73/504.12 |
| 2017/0291819 | A1* | 10/2017 | Cho | C01B 32/23 |
| 2017/0294698 | A1* | 10/2017 | Cho | C23C 28/345 |

OTHER PUBLICATIONS

Written Opinion of the International Searching Authority in corresponding/related International Application No. PCT/IB2018/060058, dated Apr. 8, 2019.

* cited by examiner

MONOLITHIC ELECTRONIC DEVICE AND METHOD OF MANUFACTURE

CROSS-REFERENCE TO RELATED APPLICATIONS

This application is a U.S. National Stage Application of International Application No. PCT/162018/060058, filed on Dec. 13, 2018, which claims priority to U.S. Provisional Patent Application No. 62/608,217, filed on Dec. 20, 2017, entitled "MULTI-DIMENSIONAL SMART SYSTEMS," the disclosures of which are incorporated herein by reference in their entirety.

BACKGROUND

Technical Field

Embodiments of the disclosed subject matter generally relate to a monolithic electronic device having a number of rigid portions arranged in a polyhedron shape and having semiconductor devices formed on both sides of at least some of the rigid portions.

Discussion of the Background

The miniaturization of electronic devices has expanded the types and uses for such devices. There are a number of technological issues limiting how small electronic devices can be made. One way of reducing the lateral footprint of an electronic device is to form a three-dimensional integrated circuit with multiple substrates, each carrying a semiconductor device, being laterally staked on top of one another. Three-dimensional integrated circuits, however, require complex heat dissipation arrangements because the heat generated by semiconductor devices lower in the stack will accumulate on the semiconductor devices higher up in the stack, which can reduce performance and/or lead to failure of the semiconductor devices higher up in the stack.

Further, three-dimensional integrated circuits require complex manufacturing processes because individual semiconductor devices are separately formed on substrates and then stacked together. Electrical interconnections between adjacent semiconductor devices in the stack require precise alignment of adjacent semiconductor devices so that the leads of the adjacent semiconductor devices in the stack are aligned. Moreover, the integration of the semiconductor devices into a stack requires careful application of adhesives to mechanically connect adjacent semiconductor devices while avoiding application of the adhesives on the semiconductor devices and electrical connections.

Thus, it would be desirable to provide systems and methods for electronic devices that require less complex manufacturing processes and address heat dissipation issues of the semiconductor devices forming the electronic device.

SUMMARY

According to an embodiment, there is a monolithic electronic device having a plurality of rigid portions arranged in a polyhedron shape and a plurality of in-plane and out-of-plane deformable portions connecting the plurality of rigid portions to each other. Each of the plurality of rigid portions has an outer side and an opposing inner side. The inner of each of the plurality of rigid portions face an inside of the polyhedron shape. At least some of the plurality of rigid portions include semiconductor devices on both the outer and inner sides. The plurality of rigid portions and the plurality of in-plane and out-of-plane deformable portions are monolithic.

According to another embodiment, there is a method of forming a monolithic electronic device. A first plurality of semiconductor devices are formed on a first side of a substrate. A second plurality of semiconductor devices are formed on a second side of the substrate. Semiconductor devices of the first plurality of semiconductor devices are aligned with a respective one of the semiconductor devices of the second plurality of semiconductor devices. In-plane and out-of-plane deformable portions connecting the first plurality of semiconductor devices are formed via the first side of the substrate. The substrate is etched via the second side of the substrate to separate the first plurality of semiconductor devices from each other so that any one of the first plurality of semiconductor devices is connected to another one of the first plurality of semiconductor only by the in-plane and out-of-plane deformable portions. The first plurality of semiconductor devices are arranged into a polyhedron shape.

According to a further embodiment, there is a self-contained, monolithic sensor system, comprising a first substrate portion having a sensor on a first side and a processor on an opposing second side; a second substrate portion having a solar panel on a first side and a battery on an opposing second side. Third, fourth, fifth, and sixth substrate portions having an antenna on a first side; and in-plane and out-of-plane deformable portions electrically and physically connecting the first, second, third, fourth, fifth, and sixth substrate portions to each other. The first, second, third, fourth, fifth, and sixth substrate portions are arranged in a polyhedron shape. The first, second, third, fourth, fifth, and sixth substrate portions and the in-plane and out-of-plane deformable portions are monolithic.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and monolithic electronic devices containing semiconductor devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
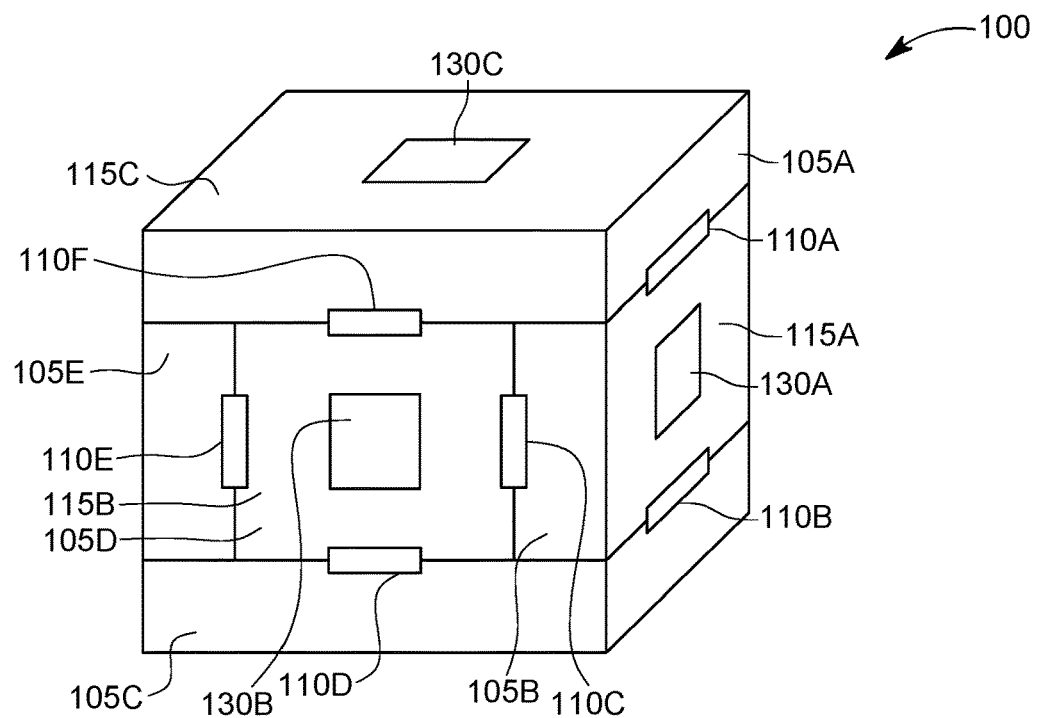
FIG. 1A is a block diagram of monolithic electronic device according to embodiments.
Figure 1B:
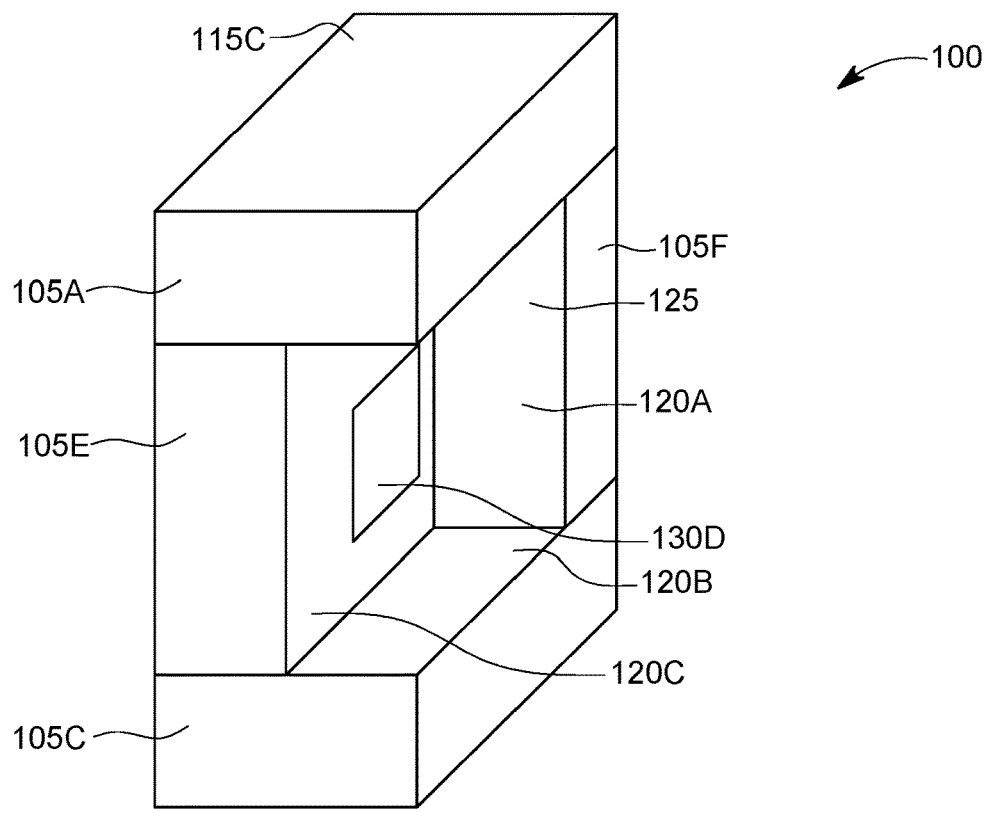
FIG. 1B is a cross-sectional view of the monolithic electronic device illustrated in FIG. 1A according to embodiments.

FIGS. 1A and 1B are block diagrams of a monolithic electronic device 100 according to embodiments. The monolithic electronic device 100 includes a plurality of rigid portions 105A-105F arranged in a polyhedron shape. In the illustrated embodiment, the polyhedron shape is a prism, more specifically is a cuboid, and even more specifically is a cube. A plurality of in-plane and out-of-plane deformable portions 110A-110F connect the plurality of rigid portions to each other. As will be appreciated from the discussion below, the monolithic electronic device 100 includes at least one in-plane and out-of-plane deformable portion connecting one of the plurality of rigid portions 105A-105F to at least one other one of the plurality of rigid portions 105A-105F. Specifically, in the discussion below, the monolithic electronic includes one rigid portion having four in-plane and out-of-plane deformable portions, three rigid portions sharing three of the four in-plane and out-of-plane deformable portions with the one rigid portion, one rigid portion sharing the fourth of the four in-plane and out-of-plane deformable portions with the one rigid portion and sharing a fifth in-plane and out-of-plane deformable portion with a sixth rigid portion. As used herein, the in-plane deformation is a stretching or compression and out-of-plane deformation is a flexing. Thus, the in-plane and out-of-plane deformable portions 110A-110F are able to stretch, compress, and flex.

Each of the plurality of rigid portions 105A-105F has an outer side 115A-115C (the outer sides of the remaining rigid portions are not visible in FIGS. 1A and 1B) and an opposing inner side 120A-120C (the inner sides of the remaining rigid portions are not visible in FIG. 1B). The inner sides 120A-120C of each of the plurality of rigid portions 105A-105F face an inside 125 of the polyhedron shape. At least some of the plurality of rigid portions 105A-105F include semiconductor devices 130A-130D on both the outer 115A-115C and inner sides 120A-120C. The plurality of rigid portions 105A-105F and the plurality of in-plane and out-of-plane deformable portions 110A-110F are monolithic. The in-plane and out-of-plane deformable portions 110A-110F both physically and electrically connect adjacent rigid portions 105A-105F to each other. Because at least some of the rigid portions include semiconductor devices on both sides and the rigid portions are arranged in a polyhedron shape, the electronic device can be considered a four-dimensional (4D) electronic device.

As will be appreciated from the discussion below, the plurality of rigid portions 105A-105F and the plurality of in-plane and out-of-plane deformable portions 110A-110F are monolithic because they are formed from the same common substrate. This is particularly advantageous because the plurality of rigid portions 105A-105F and the plurality of in-plane and out-of-plane deformable portions 110A-110F can be formed using the same type of processing as semiconductor devices 130A-130D. In one embodiment, the processing can be, for example, a CMOS process. The monolithic nature of the plurality of rigid portions 105A-105F and the plurality of in-plane and out-of-plane deformable portions 110A-110F also provides greater structural integrity to the electronic device 100 compared to attaching the plurality of in-plane and out-of-plane deformable portions 110A-110F to the plurality of rigid portions 105A-105F after forming each of these individually. Thus, one skilled in the art will recognize that an electronic device in which the plurality of rigid portions 105A-105F and the plurality of in-plane and out-of-plane deformable portions 110A-110F are formed separately and then attached to each other would not produce a monolithic electronic device.

In an embodiment, the inside 125 of the polyhedron shape is empty, i.e., it does not contain any additional components other than the inner sides 120A-120C of the plurality of rigid portions 105A-105F and the semiconductor devices 130D formed on the inner sides 120A-120C of the plurality of rigid portions 105A-105F. This is particularly advantageous because it provides a space for heat dissipation, whereas in a three-dimensional integrated circuit there is little or no open space between laterally adjacent semiconductor devices.

In one embodiment, the electronic device 100 is a self-contained, monolithic sensor system. As will be appreciated from the discussion below, the rigid portions discussed above are part of the substrate, and thus will be referred to in connection with the self-contained monolithic sensor as substrate portions. In this case, a first one of the substrate portions has a sensor on its outer side and a processor on its opposing inner side. A second substrate portion has a solar panel on a first side and a battery on an opposing second side. Third, fourth, fifth, and sixth substrate portions have an antenna on a first side. In-plane and out-of-plane deformable portions electrically and physically connect the first, second, third, fourth, fifth, and sixth substrate portions to each other. The first, second, third, fourth, fifth, and sixth substrate portions are arranged in a polyhedron shape. The first, second, third, fourth, fifth, and sixth substrate portions and the in-plane and out-of-plane deformable portions are monolithic.

Figure 2:
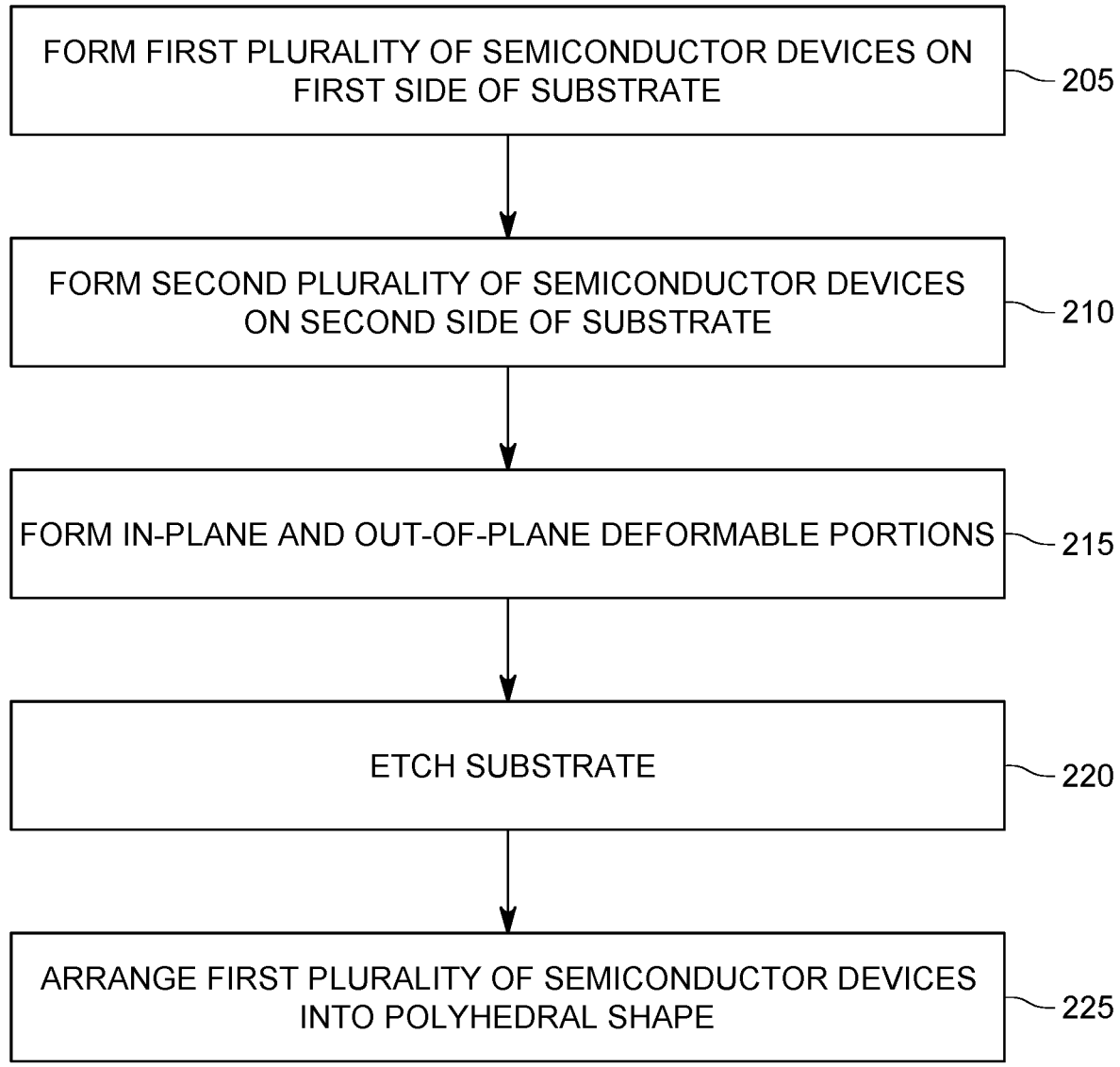
FIG. 2 is a flowchart of a method for forming a monolithic electronic device according to embodiments.

FIG. 2 is a flowchart illustrating a method of forming a monolithic electronic device according to embodiments. Initially, a first plurality of semiconductor devices are formed on a first side of a substrate (step 205). A second plurality of semiconductor devices are then formed on a second side of the substrate (step 210). Semiconductor devices of the first plurality of semiconductor devices are aligned with a respective one of the semiconductor devices of the second plurality of semiconductor devices. In-plane and out-of-plane deformable portions connecting the first plurality of semiconductor devices are formed via the first side of the substrate (step 215). The substrate is etched, via the second side of the substrate, to separate the first plurality of semiconductor devices from each other so that any one of the first plurality of semiconductor devices is connected to another one of the first plurality of semiconductor devices only by the in-plane and out-of-plane deformable portions (step 220). Finally, the first plurality of semiconductor devices is arranged into a polyhedron shape (step 225). This can be achieved by folding, along the in-plane and out-of-plane deformable portions, substrate portions carrying the first plurality of semiconductor devices into the polyhedron shape.

Figure 3A:
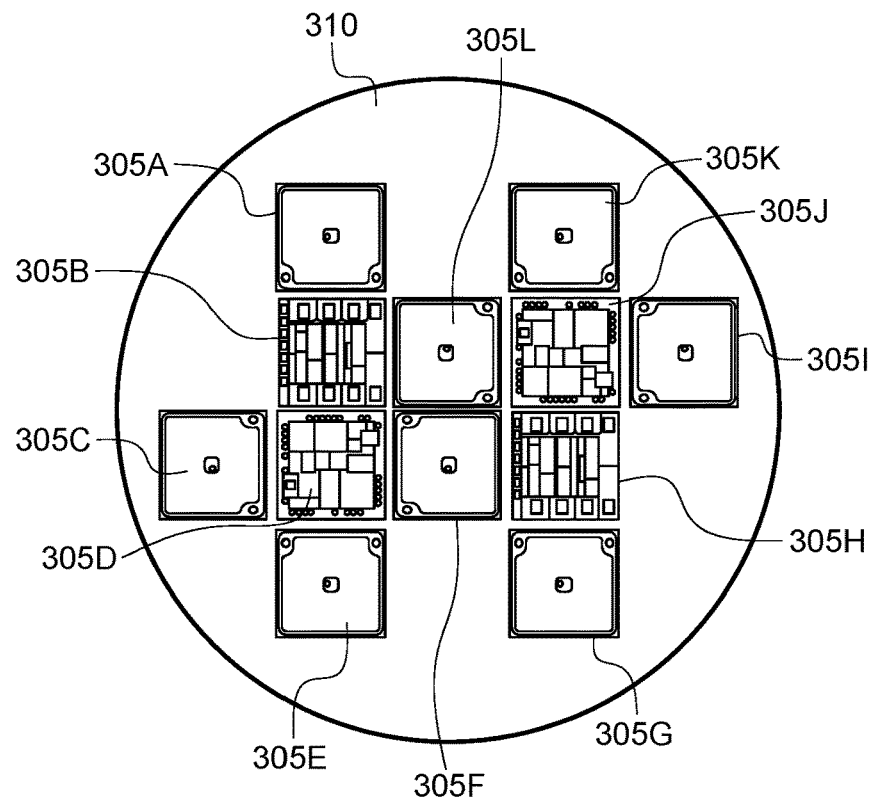
FIGS. 3A-3L are block diagrams of a method of forming monolithic electronic device according to embodiments.

A more detailed description of a method of forming a monolithic electronic device will now be described in connection with the block diagrams of FIGS. 3A-3L. Referring initially to FIG. 3A, a plurality of semiconductor devices 305A-305L are formed on a substrate 310, which can be any type of naturally rigid crystalline substrate, including, but not limited to a silicon substrate. The semiconductor devices 305A-305L can be formed using any technique, including, for example, a CMOS process. Semiconductor devices 305A-305F will be part of one electronic device and semiconductor devices 305G-305L will be part of a second electronic device. Prior to forming the semiconductor devices 305A-305L, electrical interconnections to the other side of the substrate 310 can be formed, as appropriate. These electrical interconnections can be, for example, vias. For example, deep trenches can first be formed through the substrate 310 for the through-silicon-vias (TSVs), which can then be filled with conductive metal, such as, for example, cooper, using electrochemical deposition (ECD) to establish electrical contact between devices on opposite sides of the substrate 310.

Figure 3B:
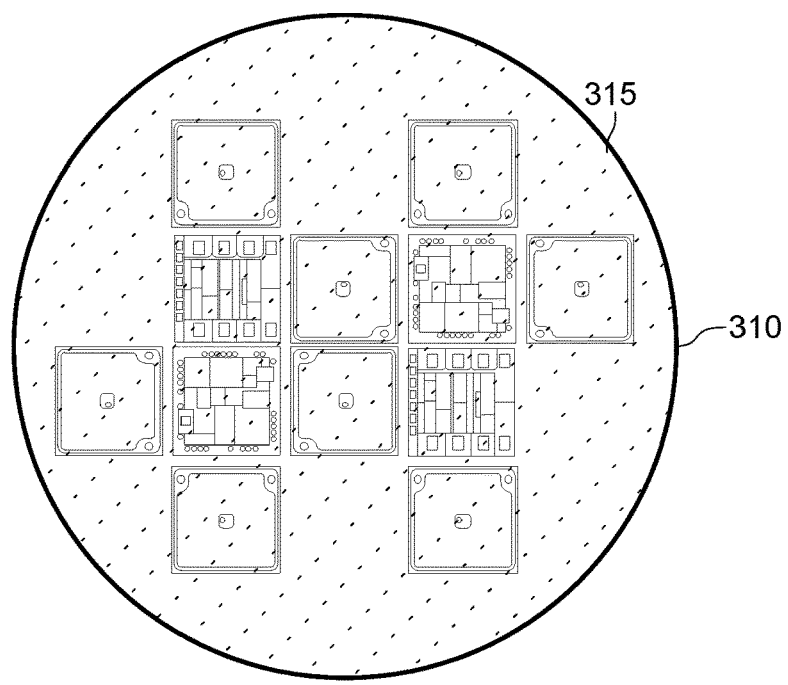
Figure 3C:
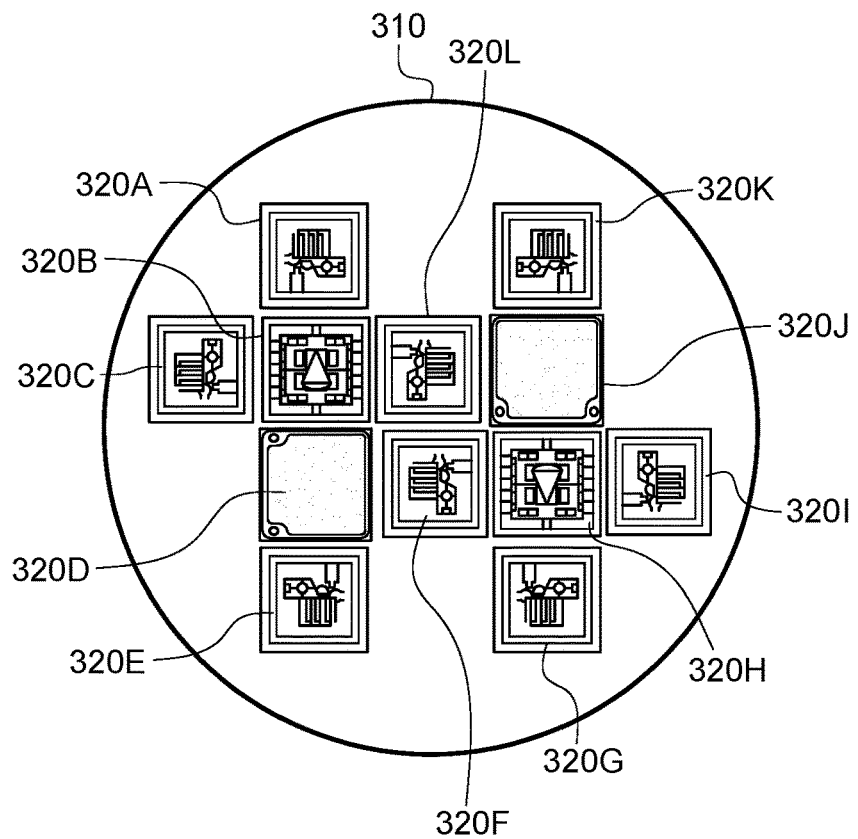
Figure 3D:
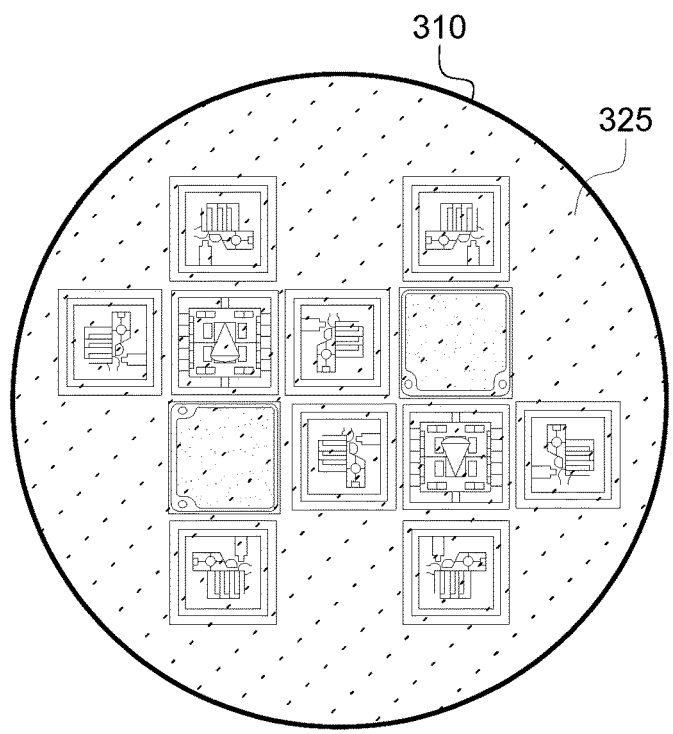

Referring now to FIG. 3B, a protective layer 315 is formed on top of the semiconductor devices 305A-305L and the substrate 310. The protective layer 315 can be any type of protective layer that can later be selectively removed, such as, for example, a photoresist. As illustrated in FIG. 3C, a plurality semiconductor devices 320A-320L are formed on the opposite side of the substrate 310 so that each of the semiconductor devices 320A-320L are aligned with a respective one of the semiconductor devices 305A-305L. The semiconductor devices 320A-320L can be formed using any technique, including, for example, a CMOS process. The opposite side of the substrate 310 and the semiconductor devices 320A-320L on the opposite side are then covered by a protective layer 325, which is illustrated in FIG. 3D. The protective layer 325 can be any type of protective layer that can later be selectively removed, such as, for example, a photoresist.

Figure 3E:
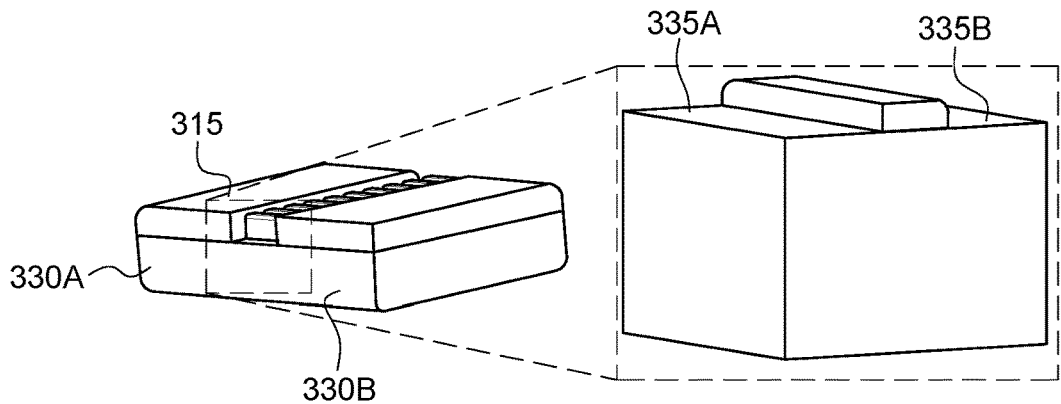

The formation of the in-plane and out-of-plane deformable portions will now be described in connection with FIGS. 3E-3G, which illustrate a portion 330A of the substrate 310 containing one pair of semiconductor devices (not illustrated) arranged on opposite sides of the substrate 310 and a portion 330B of the substrate 310 containing another pair semiconductor devices (not illustrated) arranged on opposite sides of the substrate 310. For ease of illustration, FIGS. 3E-3G do not illustrate the protective layer 325 on the opposite side of the substrate 310. Initially, as illustrated in FIG. 3E, the protective layer 315 is selectively removed to expose portions 335A and 335B of the substrate 310 between the portions 330A and 330B at which the in-plane and out-of-plane deformable portions will be formed. It will be appreciated from the left-hand side of FIG. 3E, that there will be additional portions of the substrate between portions 330A and 330B that will be selectively removed.

Figure 3F:
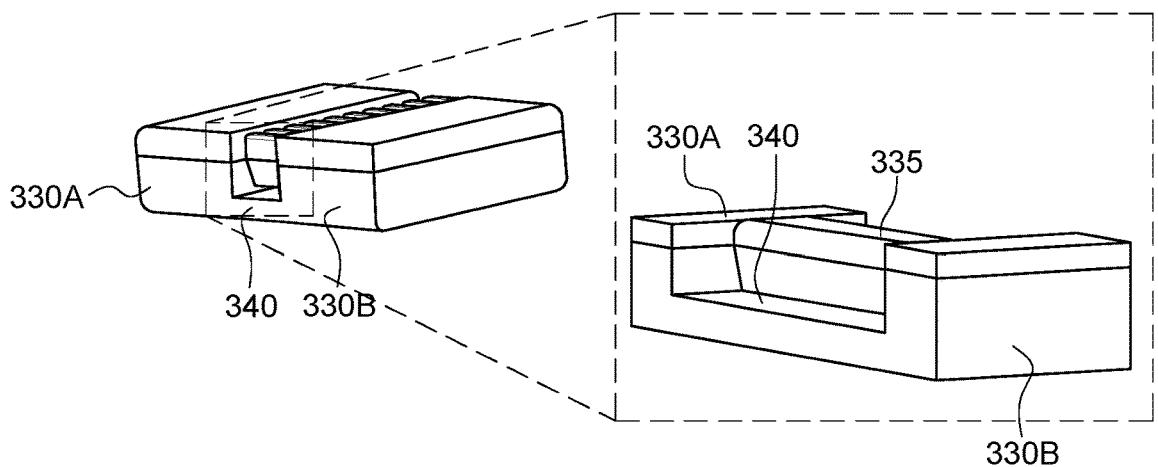
Figure 3G:
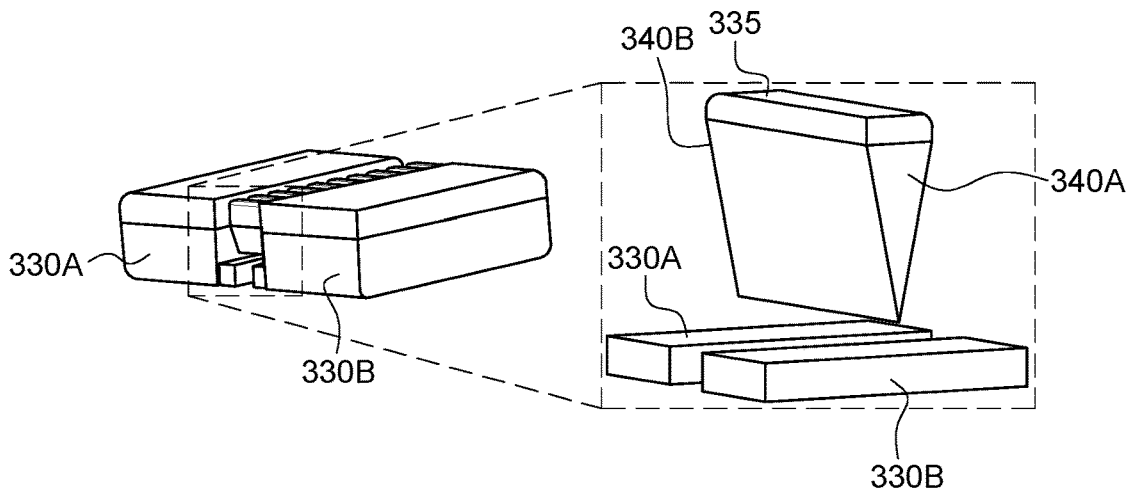

Next, as illustrated in FIG. 3F, the portions 335A and 335B of the substrate 310 from which the protective layer 315 was removed are patterned to form the desired shape of the in-plane and out-of-plane deformable portions 335. This can be achieved using, for example, a negative tapered Bosch process. Referring now to FIGS. 3F and 3G, a portion 340 of the substrate 310 connecting portions 330A and 330B is removed to separate these portions and also to separate the bottom of the in-plane and out-of-plane deformable portions 335 from the substrate 310. The lateral sides 340A and 340B of the in-plane and out-of-plane deformable portions will still be connected to lateral sides of portions 330A and 330B. This last step can be performed using, for example, a laser back-etch. Finally, the remaining portions of the protective layer 315 are then removed from the substrate 310.

Additional details of the process for forming the in-plane and out-of-plane deformable portions can be found in WO 2018/096454, the entire disclosure of which is herein expressly incorporated by reference. Thus, consistent with the disclosure in WO 2018/096454, the in-plane and out-of-plane deformable portions can have a plurality of wave-like shapes arranged in a repeating pattern, and more specifically can have a plurality of lamellae arranged in a pattern of repeating spherulites.

Figure 3H:
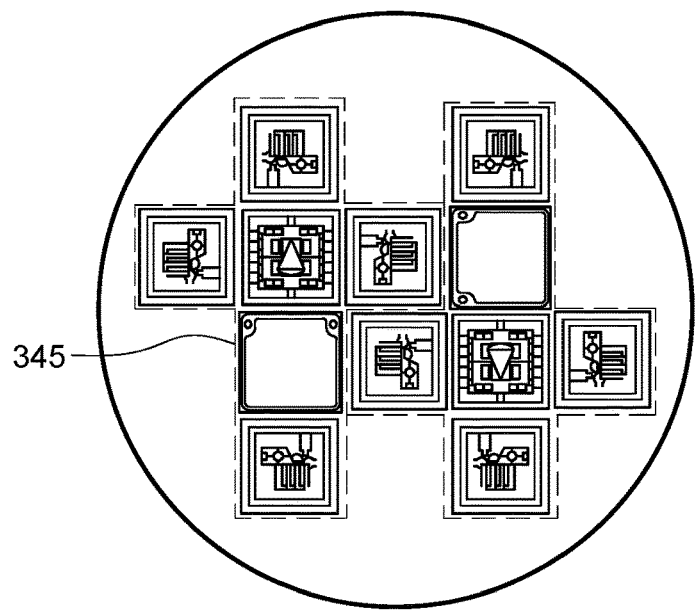

Turning now to FIG. 3H, the protective layer on the opposite side of the substrate 310 is etched along lines 345 to define the individual rigid portions of the substrate carrying the semiconductor devices. Specifically, the in-plane and out-of-plane deformable portions 335 are not etched but the areas of the substrate 310 defining the outer periphery of the rigid portions carrying the semiconductor devices. Conductive lines can then be formed on the in-plane and out-of-plane deformable portions to electrically interconnect the various devices.

Figure 3I:
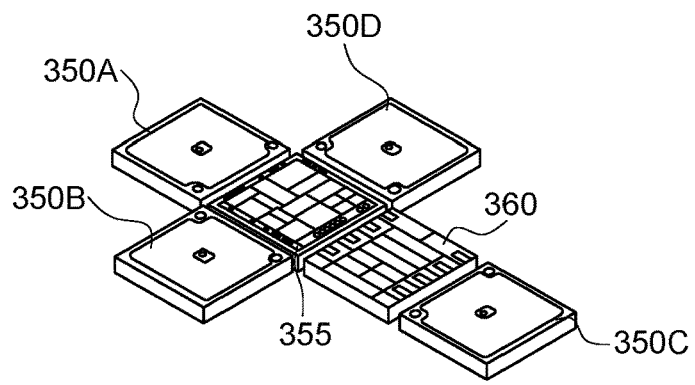
Figure 3J:
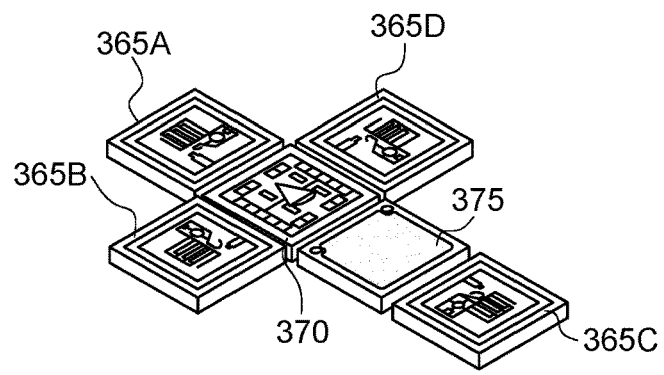
Figure 3K:
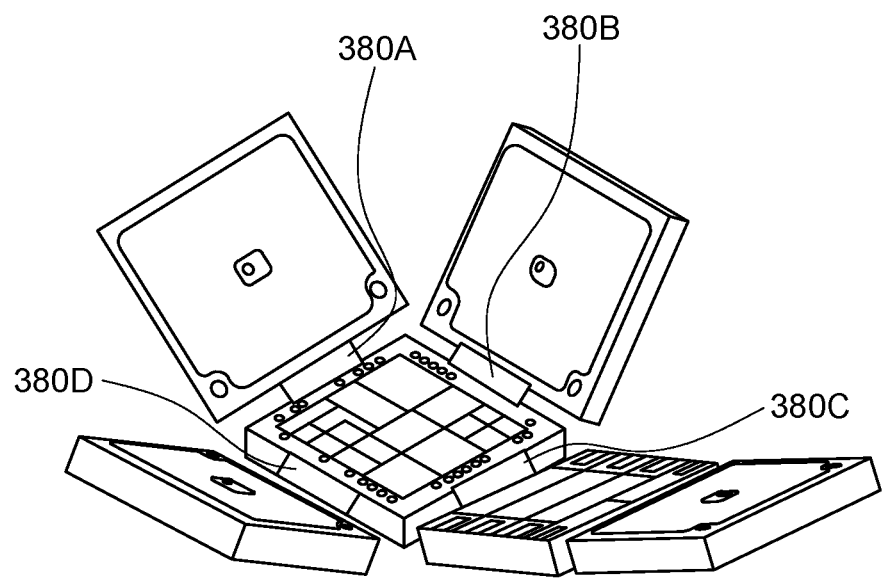
Figure 3L:
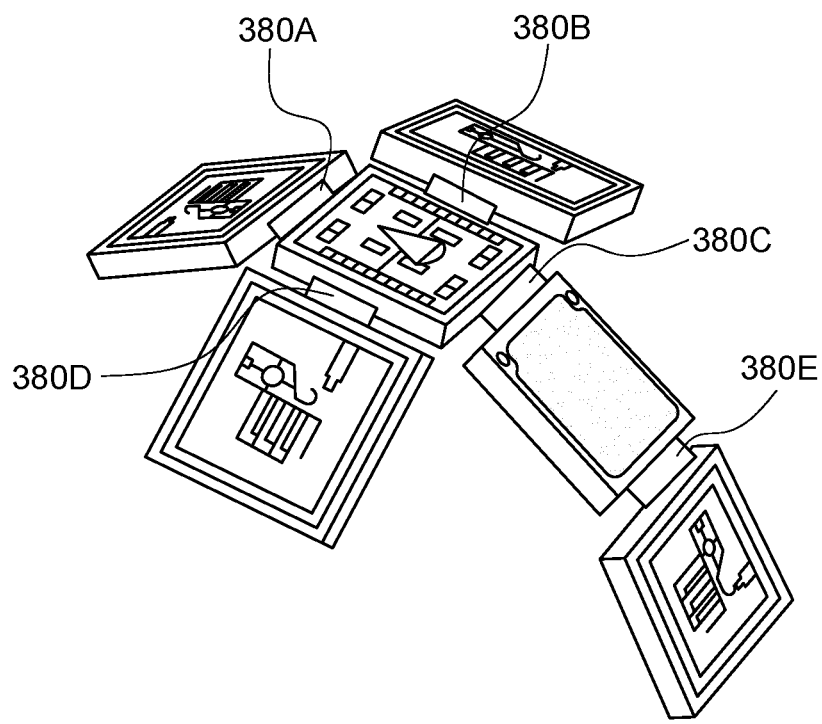

One of the two electronic devices formed from the substrate 310 is illustrated in FIGS. 3I-3L. Specifically, FIGS. 3I and 3J respectively illustrate the outer and inner sides of the electronic device in a flat position and FIGS. 3K and 3L respectively illustrate the outer and inner sides of the electronic device in a partially folded position. Referring first to FIG. 3I, the semiconductor devices on the outer side of the electronic device include antennas 350A-350D, a sensor 355, and a solar cell 360. As illustrated in FIG. 3J, the semiconductor devices on the inner side of the electronic device include a radio frequency transceiver 365A-365D aligned with the antennas 350A-350D, a processor 370 aligned with sensor 355, and a battery 375 aligned with the solar cell 360. As illustrated in FIGS. 3K and 3L, the in-plane and out-of-plane deformable portions 380A-380E stretch, compress, and flex to allow the individual rigid portions to form a polyhedron shape.

Although exemplary embodiments have been described above in connection with particular types of semiconductor devices, the disclosed monolithic electronic device can include different types of semiconductor devices.

Although FIGS. 3A-3L are described in connection with the formation of two electronic devices from a common substrate, the method described above can be used to form only one electronic device on a substrate or more than two electronic devices on a common substrate. The formation of two electronic devices from a common substrate is particularly advantageous because it maximizes the amount of the substrate used to form the electronic devices and minimizes the amount of substrate that is wasted.

As will be appreciated from the discussion above, the entire electronic device, including the in-plane and out-of-plane deformable portions and the semiconductor devices, can be formed using a single type of process, such as, for example, a CMOS process. This can significantly reduce manufacturing costs compared to the formation of a three-dimensional integrated circuit. Further, the monolithic nature of the electronic device provides significant structural integrity advantages compared to forming semiconductor devices on separate substrates and then integrating these separate substrates into an electronic device. Additionally, the open space in the inside of the polyhedron shape provides significant heat dissipation, and thus does not require the complex heat dissipation arrangements of three-dimensional integrated circuits.

One figure of merit of a flexing strategy is its processing speed and cost, both of which are related to the amount of silicon to be etched. Comparative analysis was carried out for different flexing strategies on a 4-inch wafer: complete wafer thinning; trench-protect-etch-relates (TREP), and the disclosed 4D-ES process. Compared to the silicon back etch, TPER consumed sixteen times less silicon, whereas 4D-ES consumed seventy-four times less silicon. Silicon on insulator (SOI) wafers discard as much silicon as an entire wafer thinning process and can cost up to ten times more than prime silicon substrates. Evaluated processing times were 8.5 hour for back etching, 3.5 hours for TPER, and 1.5 hours for 4D-ES.

The disclosed embodiments provide systems for monolithic electronic devices containing semiconductor devices. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A monolithic electronic device, comprising:
    a plurality of rigid portions arranged in a polyhedron shape with an empty inside volume; and
    a plurality of in-plane and out-of-plane deformable portions connecting the plurality of rigid portions to each other, wherein
    each of the plurality of rigid portions has an outer side and an opposing inner side, wherein the inner sides of each of the plurality of rigid portions face the empty inside volume of the polyhedron shape, and
    at least some of the plurality of rigid portions include a corresponding pair of semiconductor devices, one semiconductor device of the pair of semiconductor devices being located on the outer side and another semiconductor device of the pair of semiconductor devices being located on the inner side, aligned with the one semiconductor device, and
    the plurality of rigid portions and the plurality of in-plane and out-of-plane deformable portions are monolithic.

2. The monolithic electronic device of claim 1, wherein the in-plane and out-of-plane deformable portions electrically and physically connect the plurality of rigid portions to each other.

3. The monolithic electronic device of claim 1, wherein the plurality of rigid portions comprises a substrate of a same material as the plurality of in-plane and out-of-plane deformable portions.

4. The monolithic electronic device of claim 1, wherein all of the plurality of rigid portions include semiconductor devices on both the inner and outer sides.

5. The monolithic electronic device of claim 1, wherein one of the plurality of rigid portions includes a solar panel on the outer side and a battery on the inner side.

6. The monolithic electronic device of claim 5, wherein
    a second one of the plurality of rigid portions includes an antenna on the outer side and a transceiver on the inner side; and
    a third one of the plurality of rigid portions includes a sensor on the outer side and a processor on the inner side.

7. The monolithic electronic device of claim 1, further comprising:
    an open space in an interior of the polyhedron shape.

8. A method of forming a monolithic electronic device, the method comprising:
    forming a first plurality of semiconductor devices on a first side of a substrate;
    forming a second plurality of semiconductor devices on a second side of the substrate, wherein semiconductor devices of the first plurality of semiconductor devices are aligned with a respective one of the semiconductor devices of the second plurality of semiconductor devices;
    forming, via the first side of the substrate, in-plane and out-of-plane deformable portions connecting the first plurality of semiconductor devices;
    etching, via the second side of the substrate, the substrate to separate the first plurality of semiconductor devices from each other so that any one of the first plurality of semiconductor devices is connected to another one of the first plurality of semiconductor devices only by the in-plane and out-of-plane deformable portions; and
    arranging the first plurality of semiconductor devices into a polyhedron shape.

9. The method of claim 8, further comprising:
    forming a protective film on the first side of the substrate covering the first plurality of semiconductor devices.

10. The method of claim 9, further comprising:
    forming another protective on the second side of the substrate covering the second plurality of semiconductor devices.

11. The method of claim 8, wherein the formation of the in-plane and out-of-plane deformable portions comprises:
    patterning the protective film on the first side of the substrate to selectively expose portions of the first side of the substrate;
    etching, from the first side of the substrate, the selectively exposed portions of the first side of the substrate to form a plurality of substrate portions and the in-plane and out-of-plane deformable portions, wherein the each of the plurality of substrate portions include one of the first plurality of semiconductor devices and one of the second plurality of semiconductor devices; and
    etching, from the second side of the substrate, to separate the plurality of substrate portions from each other.

12. The method of claim 8, wherein the method is performed using a CMOS process.

13. The method of claim 8, further comprising:
    forming vias through the first and second sides of the substrate prior to forming the first plurality of semiconductor devices on the first side of the substrate.

14. The method of claim 13, wherein the formation of one of the second plurality of semiconductor devices on the second side of the substrate comprises:
    forming the one of the second plurality of semiconductor devices on the substrate so that the one of the second plurality of semiconductor devices is electrically connected, by way of at least one of the vias, to one of the first plurality of semiconductor devices.

15. The method of claim 8, wherein the arranging of the first plurality of semiconductor devices into a polyhedron shape comprises:

folding, along the in-plane and out-of-plane deformable portions, substrate portions carrying the first plurality of semiconductor devices into the polyhedron shape.

16. A self-contained, monolithic sensor system, comprising:

a first substrate portion having a sensor on a first side and a processor on an opposing second side, wherein the sensor is aligned with the processor;

a second substrate portion having a solar panel on a first side and a battery on an opposing second side, wherein the solar panel is aligned with the battery;

third, fourth, fifth, and sixth substrate portions having an antenna on a first side; and in-plane and out-of-plane deformable portions electrically and physically connecting the first, second, third, fourth, fifth, and sixth substrate portions to each other, wherein the first, second, third, fourth, fifth, and sixth substrate portions are arranged in a polyhedron shape with an empty inside volume, and the first, second, third, fourth, fifth, and sixth substrate portions and the in-plane and out-of-plane deformable portions are monolithic.

17. The self-contained, monolithic sensor system of claim 16, wherein the first substrate portion has the in-plane and out-of-plane deformable portions on all four lateral sides, the second substrate portion has the in-plane and out-of-plane deformable portions on two opposing lateral sides, and the third, fourth, fifth, and sixth substrate portions have the in-plane and out-of-plane deformable portions on only one lateral side.

18. The self-contained, monolithic sensor system of claim 16, further comprising:

a radio frequency wireless transceiver arranged on a second side of at least one of the third, fourth, fifth, and sixth substrate portions.

19. The self-contained, monolithic sensor system of claim 16, further comprising:

a protective layer arranged on the first side of the first, second, third, fourth, fifth, and sixth substrate portions.

\* \* \* \* \*